(12) United States Patent
Owada et al.

(10) Patent No.: US 10,061,197 B2
(45) Date of Patent: Aug. 28, 2018

(54) LIGHT IRRADIATION DEVICE AND METHOD FOR PATTERNING SELF ASSEMBLED MONOLAYER

(71) Applicant: USHIO DENKI KABUSHIKI KAISHA, Tokyo (JP)

(72) Inventors: Tatsushi Owada, Tokyo (JP); Shinji Suzuki, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/326,207

(22) PCT Filed: Jul. 9, 2015

(86) PCT No.: PCT/JP2015/003467
§ 371 (c)(1),
(2) Date: Jan. 13, 2017

(87) PCT Pub. No.: WO2016/009624
PCT Pub. Date: Jan. 21, 2016

(65) Prior Publication Data
US 2017/0199463 A1    Jul. 13, 2017

(30) Foreign Application Priority Data
Jul. 17, 2014    (JP) ................................. 2014-146959

(51) Int. Cl.
*H01J 61/16*    (2006.01)
*G03F 7/20*    (2006.01)
(Continued)

(52) U.S. Cl.
CPC .......... *G03F 7/2004* (2013.01); *G03F 7/0002* (2013.01); *G03F 7/165* (2013.01);
(Continued)

(58) Field of Classification Search
CPC ........ G03F 7/0002; G03F 7/165; G03F 7/168; G03F 7/2004; G03F 7/7015;
(Continued)

(56) References Cited

U.S. PATENT DOCUMENTS 6,282,222 B1 * 8/2001 Wieser .................... H01J 61/16
                                                              372/57
6,901,090 B1 * 5/2005 Ohtsuki .................... G02F 1/37
                                                              372/21
(Continued)

FOREIGN PATENT DOCUMENTS

JP    2005-159322 A    6/2005
JP    2007-013150 A    1/2007
(Continued)

OTHER PUBLICATIONS

Machine translation of JP 2013-143253 (no date).*
(Continued)

*Primary Examiner* — Amanda C. Walke
(74) *Attorney, Agent, or Firm* — Studebaker & Brackett PC

(57) ABSTRACT

Disclosed herein a vacuum ultra violet light source device that is capable of suppressing an amount of ozone generation when the vacuum ultra violet light is emitted into an atmosphere containing oxygen, a light irradiation device incorporating the vacuum ultra violet light device, and a method of patterning a self-assembled monolayer employing the light irradiation device. The light irradiation device is configured to irradiate a self-assembled monolayer (SAM) formed on a workpiece with light containing vacuum ultra violet light through a mask M on which a prescribed pattern is formed so as to perform a patterning process of the SAM. The light containing the vacuum ultra violet light to be irradiated onto the SAM is light that is pulsed light and has (Continued)

a duty ratio of light emission equal to or greater than 0.00001 and equal to or less than 0.01.

12 Claims, 12 Drawing Sheets

(51) Int. Cl.

| | |
|---|---|
| *H01L 21/027* | (2006.01) |
| *H05B 41/34* | (2006.01) |
| *H01J 61/90* | (2006.01) |
| *G03F 7/00* | (2006.01) |
| *G03F 7/16* | (2006.01) |
| *H01S 3/225* | (2006.01) |

(52) U.S. Cl.
CPC ............ *G03F 7/168* (2013.01); *G03F 7/7015* (2013.01); *G03F 7/70041* (2013.01); *G03F 7/70466* (2013.01); *H01J 61/16* (2013.01); *H01J 61/90* (2013.01); *H01L 21/0274* (2013.01); *H01S 3/225* (2013.01); *H01S 3/2253* (2013.01); *H01S 3/2255* (2013.01); *H05B 41/34* (2013.01)

(58) Field of Classification Search
CPC ............. G03F 7/70466; G03F 7/70041; H01L 21/0274; H01J 61/16; H01J 61/90; H01S 3/225; H01S 3/2253; H01S 3/2255
USPC ................. 430/270.1, 396, 397; 355/30, 77; 250/492.1; 315/11.01, 111.21
See application file for complete search history.

(56) References Cited

U.S. PATENT DOCUMENTS

| | | | | |
|---|---|---|---|---|
| 6,965,624 B2 * | 11/2005 | Albrecht | ............. | G02B 5/1814 372/38.05 |
| 2014/0239192 A1 * | 8/2014 | Schneider | ........... | G03F 7/70191 250/453.11 |

FOREIGN PATENT DOCUMENTS

| | | |
|---|---|---|
| JP | 2013-143253 A | 7/2013 |
| WO | 01/20398 A1 | 3/2001 |

OTHER PUBLICATIONS

An Office Action; "Notice of Grounds for Rejection" issued by the Japanese Patent Office dated Feb. 14, 2017, which corresponds to Japanese Patent Application No. 2014-146959 and is related to U.S. Appl. No. 15/326,207; with English language translation.

Keishi Yauchi; "VUV Light Source of CO gas Discharge"; Kochi Tech University, Postgraduate School of Engineering, Engineering Science Major, Electronics and Optics System Course; Japan; Feb. 19, 2007; URL, http://kochi-tech.ac.jp/library/ron/2006/g13/M/1095320.pdf; with English language concise explanation; 61pp.

International Search Report issued in PCT/JP2015/003467; dated Aug. 4, 2015.

Sugimura, H. "An Optical Micro Fabrication of an Organic Monolayer" Japan Vacuum Association, "The Vacuum", vol. 48, No. 9 (2005), pp. 506-510.

An Office Action; "Notice of Grounds for Rejection" mailed by the Japanese Patent Office dated Jun. 20, 2017, which corresponds to Japanese Patent Application No. 2014-146959 and is related to U.S. Appl. No. 15/326,207; with English translation.

* cited by examiner

LIGHT IRRADIATION DEVICE AND METHOD FOR PATTERNING SELF ASSEMBLED MONOLAYER

TECHNICAL FIELD

The present invention relates to a vacuum ultra violet light source device that emits light containing vacuum ultra violet light, a light irradiation device that incorporates the vacuum ultra violet light source device. The present invention also relates to a method for patterning a self-assembled monolayer (or self-assembled monomolecular film) that employs the light irradiation device.

BACKGROUND ART

Recent years, vacuum ultra violet (VUV) light having a wavelength equal to or less than 200 nm has been widely used not only in a semiconductor exposure field but also in other various fields. For example, a certain technique has been developed that patterns a self-assembled monolayer (hereinafter referred to as "SAM" or "SAM film") by directly triggering a chemical reaction on the SAM with the light by use of the VUV light and a mask, without performing a pattern forming process by use of the photoresist.

More particularly, for example, Non-Patent Literature 1, which will be listed below, discloses that the VUV light is capable of performing the light patterning process of the SAM (i.e., self-assembled monolayer) without depending on a particular functional group. In particular, in the technique of NPL 1, an excimer lamp having the wavelength of 172 nm, which is used for eliminating the contaminant consisting of an organic substance, is employed as a light source for the exposure. This technique of NPL 1 focuses attention on the oxidative decomposition removal reaction of the SAM with the VUV light, and thus has been expected to be evolved for various kinds of optical micro-processing (micro-fabricating) of the SAM.

Meanwhile, as the vacuum ultra violet light source (hereinafter also referred to as "VUV light source"), conventionally, a low pressure mercury lamp having a bright line (or emission line) at the wavelength of 185 nm. On the other hand, nevertheless, it has been known that the VUV light within the wavelength band, in particular, equal to or less than 180 nm is capable of achieving the surface modification (for example, the asking or the like) at high speed. For this reason, recent years, a xenon excimer lamp that emits light having a wavelength of 172 nm has been mostly used as the VUV light source.

However, the above mentioned lamps emitting the VUV light generally have the longer light emitting part, in other words, the longer light emitting length. For example, the low pressure mercury lamp (i.e., "UL0-6DQ", manufactured by USHIO DENKI KABUSHIKI KAISHA (USHIO Inc.)) has the light emitting length of 10 cm. Likewise, for example, the excimer light unit incorporating the xenon excimer lamp (i.e., "SUS06", manufactured by USHIO DENKI KABUSHIKI KAISHA (Inc.)) has the light emitting length of 10 cm as well.

The VUV light emitted from those kinds of VUV lamps is a divergent light as the light emitting portion thereof has a substantially circular cylindrical shape. In the case of the divergent light, as it is difficult to perform the projection exposure, instead the contact exposure or the proximity exposure is supposed to be performed. In this case, the exposure to the to-be-irradiated object is affected by the wraparound (or speaking) of the divergent light. As a result, the pattern size that is to be resolvable is utmost approximately 100 µm of the line pattern width.

In order to achieve the miniaturization of the pattern line width (i.e., the fine pattern line width), it is required to employ the lamp that has a sufficiently short light emitting length and a higher light intensity of the vacuum ultra violet light to the extent being practically sufficient so as to be assumed to be a point light source, and to perform the exposure with little wraparound (sneaking) of the light. For this reason, as the light source to be used for patterning the SAM, it is conceivable to employ a flash lamp that has the light emitting length equal to or less than 12.5 mm and emits the VUV light having a sufficiently higher light intensity for the practical use. By combining the above mentioned flash lamp with a paraboloid mirror to be used, it makes it possible to achieve a light source device that is capable of extracting light that is the VUV light and also parallel or substantially parallel light. As such, a light irradiation device incorporating the above mentioned light source device is capable of achieving the miniaturization of the pattern line width (i.e., the fine pattern line width) in the patterning of the SAM.

It should be noted that an excimer laser device, which is used for the semiconductor exposure, can be also employed as another VUV light source other than the above mentioned lamps. According to an excimer laser exposure apparatus that incorporates such excimer laser device, it makes it possible to achieve the miniaturization of the pattern line width in the patterning of the SAM. However, the excimer laser device and the excimer laser exposure apparatus are considerably costly, thus it is impractical to employ the excimer laser device or the excimer laser exposure apparatus for the use other than the semiconductor exposure which is in the stage of commercial mass production, from the viewpoint of cost of ownership (COO). In other words, the excimer laser device can be employed only for the use in the limited field of industry that is proportional to the COO.

LISTING OF PRIOR ART REFERENCES

NON-PATENT LITERATURE DOCUMENT 1: "An Optical Micro Fabrication of an Organic Monolayer", Hiroyuki Sugimura, "The Vacuum", Japan Vacuum Association, 2005, Vol. 48, No. 9, p. 506 to 510

SUMMARY OF THE INVENTION

Problems to be Solved by the Invention

In the meantime, the VUV light is required to be used in a vacuum or alternatively in an inert gas atmosphere as the VUV light is absorbed by oxygen in the atmospheric air. However, in the case that the SAM is irradiated with the VUV light in an atmosphere that does not contain oxygen, the VUV light only performs the direct decomposition (dissociation) of the SAM so that it is hardly achievable to improve the patterning rate.

On the other hand, in the case that the SAM is irradiated with the VUV light in a processing atmosphere that contains oxygen, such as the atmospheric air or the like, oxygen in the vicinity of a surface of the SAM is converted into active oxygen (in other words, reactive oxygen or radical oxygen) with the VUV light irradiation. Thus, it makes it possible to perform the oxidative decomposition reaction of the SAM by the above mentioned active (radical) oxygen as well as the above mentioned direct decomposition of the SAM film by the VUV light. In this regard, an existence of the oxidative decomposition reaction by the active oxygen is a contributing factor for improving the patterning rate of the SAM. For this reason, it is preferable to perform the patterning of the SAM in the air (in the atmospheric air) in order to ensure the sufficiently higher patterning rate of the SAM.

However, when a workpiece undergoes the light irradiation process using the VUV light having the wavelength equal to or less than 200 nm, ozone is inevitably generated on the to-be-irradiated surface of the workpiece with the VUV light or a space including the to-be-irradiated surface of the workpiece.

Ozone is assumed to be generated by the chemical reaction as the followings.

First, an oxygen molecule in the air absorbs the ultra violet light and then is converted into an excited state.

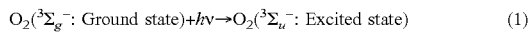

$$O_2(^3\Sigma_g^-: \text{Ground state}) + h\nu \rightarrow O_2(^3\Sigma_u^-: \text{Excited state}) \quad (1)$$

Next, the oxygen molecule in the excited state is converted into the oxygen atoms in the excited state.

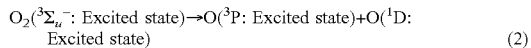

$$O_2(^3\Sigma_u^-: \text{Excited state}) \rightarrow O(^3P: \text{Excited state}) + O(^1D: \text{Excited state}) \quad (2)$$

Alternatively, the oxygen molecule in the air absorbs the ultra violet light and then is converted into the oxygen atoms in the excited state.

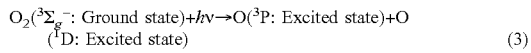

$$O_2(^3\Sigma_g^-: \text{Ground state}) + h\nu \rightarrow O(^3P: \text{Excited state}) + O(^1D: \text{Excited state}) \quad (3)$$

Subsequently, the ozone is generated by the triple collision (or three body collision) among the oxygen atom in the exited state O ($^1$D: Excited state), the oxygen molecule, and an ambient medium M (such as nitrogen molecule or the like).

$$O(^1D) + O_2 + M \rightarrow O_3 \quad (4)$$

In the case in which the SAM is irradiated with the VUV light and undergoes the patterning process, as shown in FIG. 11, the VUV light (or VUV) from the VUV light source 200, which has passed through the mask pattern of the mask M, is irradiated onto the SAM film (SAM) on the workpiece W. The SAM is ideally to be patterned by the oxidative decomposition removal reaction or the like of the SAM with the VUV light in a region irradiated with the VUV light.

However, in the case of the VUV light irradiation in the atmospheric air, in fact, for example as shown in FIG. 12, ozone $O_3$ is inevitably generated. The life duration of generated ozone $O_3$ is in a span of several tens of seconds. For this reason, the oxidative decomposition reaction between ozone $O_3$ and the SAM also occurs (that is, so-called ozone etching O3 as shown in FIG. 12) in parallel with the oxidative decomposition removal reaction of the SAM with the VUV light. As a result, a desired pattern is not necessarily formed on the SAM in terms of the patterning of the SAM. In other words, a drawback may be entailed such as an enlarged etching width or a partial defect or deficiency (i.e., etching) of the SAM.

Under the above mentioned circumstances, in the case in which the SAM is patterned with the VUV light in the atmosphere containing oxygen such as the atmospheric air, it is required to consider an influence of ozone generated with the VUV light irradiation. However, the technique disclosed in the above mentioned non-patent literature (NPL) 1 completely fails to consider the above mentioned drawback.

An object of the present invention is therefore to provide a vacuum ultra violet light source device that is capable of suppressing an amount of ozone generation generated when the vacuum ultra violet light is irradiated into an atmosphere containing oxygen, a light irradiation device incorporating the vacuum ultra violet light source device, and a method for patterning a self-assembled monolayer (SAM) employing the light irradiation device, in terms of the vacuum ultra violet light source device emitting light containing the vacuum ultra violet light.

Solution to Overcome the Problems

In order to solve the above mentioned problem, according to one aspect of the present invention, there is provided a vacuum ultra violet light source device that emits light containing vacuum ultra violet light. The device emits, as the light containing vacuum ultra violet light, light that is pulsed light and has a duty ratio of light emission equal to or greater than 0.00001 and equal to or less than 0.01 in an atmosphere containing oxygen. With this configuration, it makes it possible to suppress an amount of ozone generated with an oxygen molecule in an atmosphere containing oxygen, such as an atmospheric air, absorbing ultra violet light when the vacuum ultra violet light is emitted in the atmosphere.

Also, according to another aspect of the present invention, the duty ratio of the light emission may be equal to or greater than 0.0001 and equal to or less than 0.001. With this configuration, it makes it possible to sufficiently reduce the amount of ozone generation to the extent that the ozone entails no problem in a practical sense under a light emission condition that can be relatively easily achieved.

Furthermore, according to yet another aspect of the present invention, the light source device may be provided with a flash lamp having an arc tube made of a vacuum ultra violet light permeable (transmissive) material and a pair of electrode arranged in the art tube and facing each other; a power feeder unit configured to feed power to the flash lamp. In this way, as the flash lamp is used as a light source that emits light containing the vacuum ultra violet light, it makes it possible to emit light that appropriately satisfies the above mentioned light emitting condition.

Yet furthermore, according to yet another aspect of the present invention, in the flash lamp, an inter-electrode distance between the pair of the electrodes may be equal to or less than 12.5 mm, and a gas containing a xenon gas may be enclosed in the arc tube. With this configuration, the flash lamp is capable of emitting vacuum ultra violet light having a sufficiently short light emitting length to the extent that the flash lamp can be assumed to be a point light source. As a result, the flash lamp is capable of being used as a lamp for performing a fine patterning using a mask.

Yet furthermore, according to one aspect of a light irradiation device of the present invention, there is provided a light irradiation device comprising: a mask arranged at a distance from a workpiece on which a self-assembled monolayer is formed and having a prescribed pattern being formed on the mask; a vacuum ultra violet light source device according to any one of the above mentioned light source device that irradiates the workpiece with light containing vacuum ultra violet light through the mask; and an enclosure (enclosing) member configured to enclose a light path of the light from the vacuum ultra violet light source device to the mask. Inside the enclosure member is purged by an inert gas, and a gas layer containing oxygen is formed between the mask and the workpiece.

With this configuration, as the inert gas purges oxygen inside the enclosure member which encloses the light path from the light source device to the mask, it makes it possible to prevent the vacuum ultra violet light being absorbed and attenuated by oxygen. In addition, as the gas layer containing oxygen is formed between the mask and the workpiece, it makes it possible to perform the patterning process of the self-assembled monolayer (SAM) by the vacuum ultra violet light in the atmosphere containing oxygen. For this reason, oxygen in the vicinity of a surface of the SAM is converted into active (radical) oxygen so that it makes it possible to perform the oxidative decomposition reaction between the active oxygen and the SAM. As a result, it makes it possible to improve the patterning rate of the SAM.

Yet furthermore, according to one aspect of the vacuum ultra violet light source device, the light source device emits, as the light containing vacuum ultra violet light, light that is pulsed light and has a duty ratio of light emission equal to or greater than 0.00001 and equal to or less than 0.01. For this reason, it makes it possible to suppress the amount of ozone generated with the oxygen molecule between the mask and the workpiece absorbing ultra violet light. As a result, it makes it possible to suppress the patterning being deformed due to the ozone etching so as to achieve a satisfactory patterning.

Yet furthermore, according to one aspect of a method for patterning a self-assembled monolayer of the present invention, there is provided a method for patterning a self-assembled monolayer. The method irradiates the self-assembled monolayer formed on a workpiece with light containing vacuum ultra violet light through a mask in which a prescribed pattern is formed. The method radiates, as the light containing the vacuum ultra violet light, light that is pulsed light and has a duty ratio of light emission equal to or greater than 0.00001 and equal to or less than 0.01.

With this configuration, it makes it possible to perform the desired patterning process of the SAM while suppressing the amount of ozone generation. As a result, it makes it possible to suppress an undesired ozone etching so as to achieve a satisfactory patterning.

Yet furthermore, according to another aspect of the present invention, the above mentioned method for patterning the self-assembled monolayer may radiate, as the light containing the vacuum ultra violet light, light that has the duty ratio of the light emission equal to or greater than 0.001 and equal to or less than 0.001. With this configuration, it makes it possible to perform the desired patterning process of the SAM in a state in which the amount of ozone generation is sufficiently reduced to the extent that the amount of ozone generation entails no problem in a practical sense.

Advantageous Effects of the Invention

According to embodiments of the vacuum ultra violet light source device of the present invention, it is possible to suppress the amount of ozone generated when the vacuum ultra violet light is emitted in an atmosphere containing oxygen, such as the atmospheric air. For this reason, according to the light irradiation device incorporating the vacuum ultra violet light source device, it is possible to suppress the ozone etching due to the oxidative decomposition reaction between the ozone generated and the SAM in the patterning process of the SAM in the atmosphere containing oxygen so as to achieve a satisfactory patterning.

The above mentioned purpose, embodiments and effects, as well as a purpose, embodiments and effects that has not yet mentioned above, will be apparent for the skilled in the art pertaining to the present invention from following embodiments for carrying out the invention (that is, the detailed description of the invention), which will be described in detail below, with referring to the accompanying drawings and appended claims.

DETAILED DESCRIPTION OF THE EMBODIMENTS

Hereinafter, embodiments of the present invention will be described in detail with referring to the accompanying drawings.

The inventor(s) of the present invention have conducted an experiment for measuring an ozone concentration as described below in order to investigate an amount of ozone generation generated with the oxygen molecule in a processing atmosphere such as the atmospheric air absorbing the vacuum ultra violet light (i.e., VUV light).

More particularly, an excimer lamp that emits the VUV light having the center wavelength of 172 nm and a VUV flash lamp that has a higher light intensity in the VUV region (that is, a VUV short arc flash lamp: hereinafter referred to as "VUV-SFL") were both used, and an amount of ozone generation from both lamps were investigated, respectively, when an integrated irradiance level of the VUV light from both of lamps into the air were assumed to be identical to each other.

Figure 1:
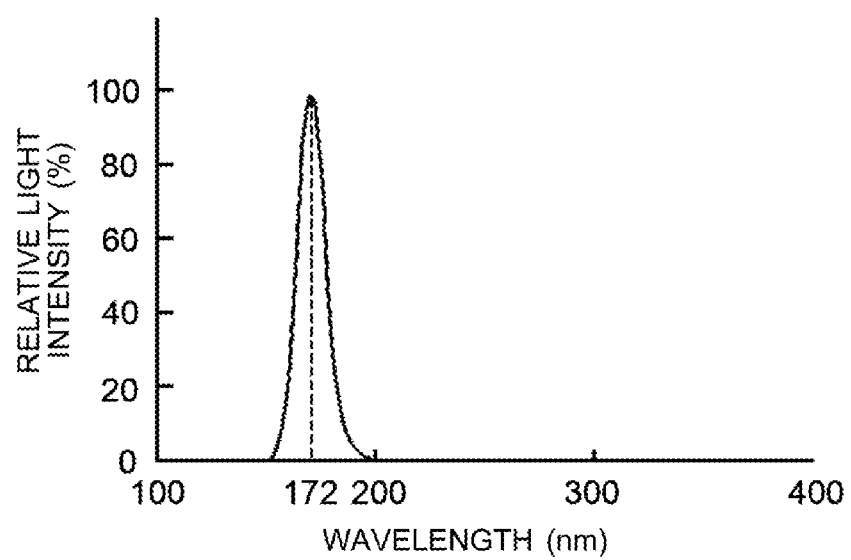
FIG. 1 is a view illustrating a spectral distribution of light emitted from an excimer lamp.

As an excimer light irradiation unit radiating the excimer light, "Min-Excimer SUS713", manufactured by USHIO DENKI KABUSHIKI KAISHA (USHIO Inc.), was used. The light emitting length of the lamp is 100 mm, and the frequency of the power supply for supplying power to the lamp is 140 kHz. FIG. 1 shows the spectral distribution of the light emitted from this type of excimer lamp. It should be noted that, in FIG. 1, the horizontal axis denotes the wavelength [nm] and the vertical axis denotes the relative intensity of light [%].

Figure 2:
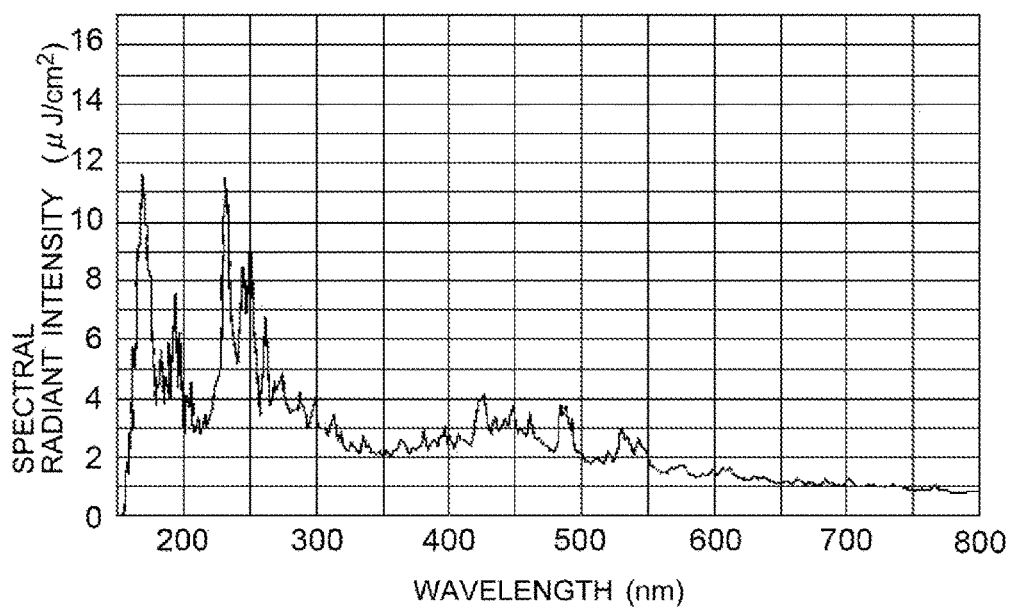
FIG. 2 is a view illustrating a spectral distribution of light emitted from a VUV-SFL.

On the other hand, as the VUV-SFL, a certain flash lamp was used in which the inter-electrode distance between a pair of electrodes arranged in an arc tube, which is made of a vacuum ultra violet light permeable material (such as a quartz glass tube or the like), is equal to or less than 12.5 mm, and a gas containing a xenon gas is enclosed in the arc tube at the enclosing gas pressure of 3 atm. FIG. 2 shows the spectral distribution of the light radiated from this type of VUV-SFL. It should be note that, in FIG. 2, the horizontal axis denotes the wavelength [nm] and the vertical axis denotes the spectral radiant intensity [μJ/cm$^2$].

Hereinafter, an exemplary configuration of the VUV-SFL will be described below.

Figure 3:
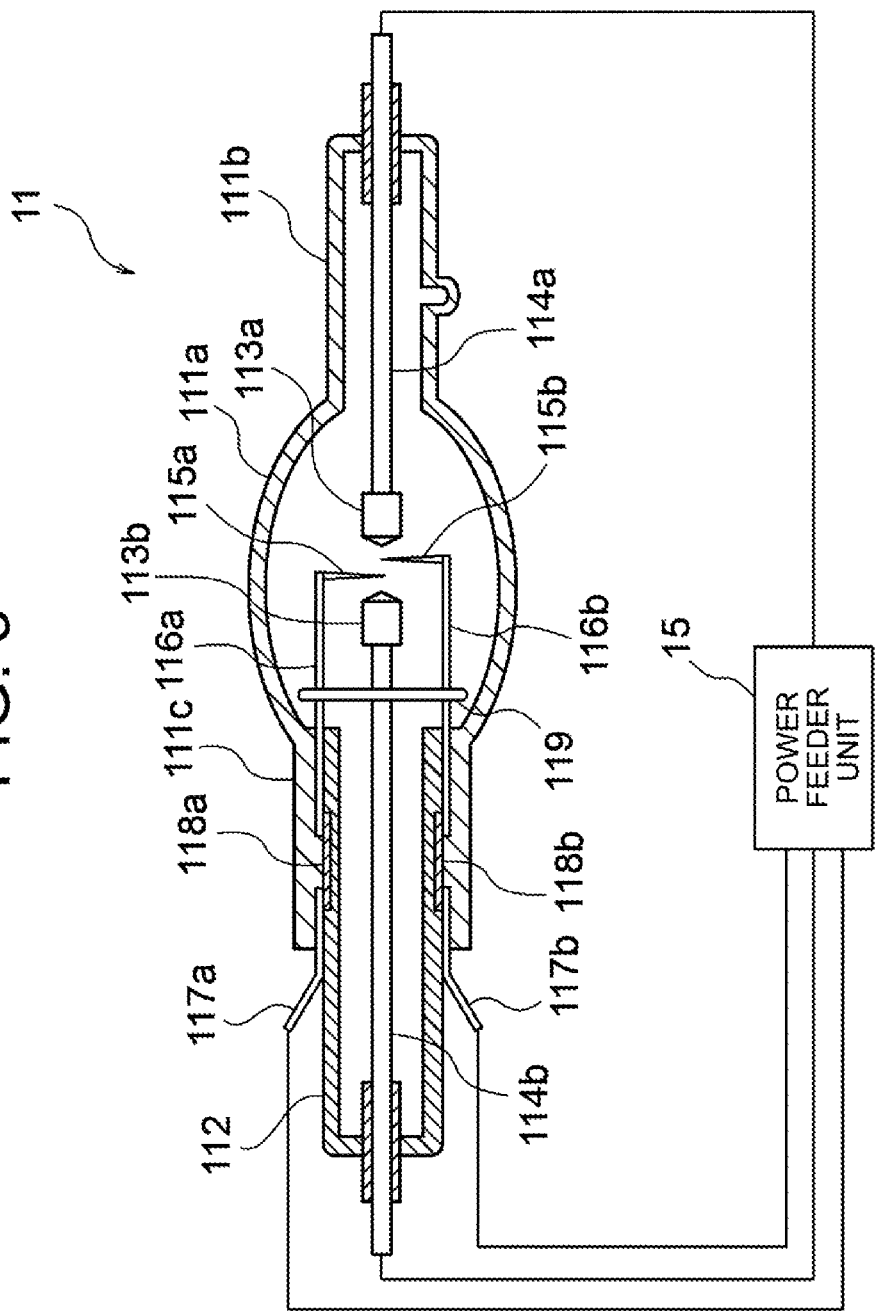
FIG. 3 is a view illustrating an exemplary configuration of the VUV-SFL.

FIG. 3 shows an exemplary configuration of a double-ended type short arc flash lamp as an example of the VUV-SFL.

As shown in FIG. 3, the VUV-SFL 11 is provided with an arc tube 111a. At both ends of the arc tube 111a, a first sealing tube 111b and a second sealing tube 111c are consecutively connected, respectively. Also, a sealing glass tube 112 is inserted into the second sealing tube 111c, and both of the sealing glass tube 112 and the second sealing tube 111c are welded to each other.

Inside the arc tube 111a, a pair of electrodes (namely, a first main electrode 113a and a second main electrode 113b) are arranged to be opposed to each other. A lead 114a extending from the first main electrode 113a is supported and sealed with respect to the first sealing tube 111b by a stepped connection (step jointed) glass or the like, and is introduced (lead out) outwardly towards the outside thereof.

Also, a pair of starting auxiliary electrodes 115a and 115b are arranged between the main electrodes 113a and 113b in the arc tube 111a. An internal lead 116a of the starting auxiliary electrode 115a is electrically connected to an external lead 117a of the starting auxiliary electrode 115a through a metal foil 118a in the welded region between the second sealing tube 111c and the sealing glass tube 112. Likewise, an internal lead 116b of the starting auxiliary electrode 115b is electrically connected to an external lead 117b of the starting auxiliary electrode 115b through a metal foil 118b in the welded region between the second sealing tube 111c and the sealing glass tube 112.

In addition, a supporter 119 is provided between the pair of internal leads 116a and 116b. The supporter 119 is configured to position the starting auxiliary electrodes 115a and 115b.

The leads 114a and 114b, and the external leads 117a and 117b are connected to a power feeder unit 15, respectively. The power feeder unit 15 includes a capacitor, which is not shown, which stores prescribed energy. The power feeder unit 15 applies high voltage between the pair of electrodes 113a and 113b by charging the capacitor. Also, in this state, the power feeder unit 15 supplies a high voltage pulse between the pair of starting auxiliary electrodes 115a and 115b as trigger voltage. As a result, the power feeder unit 15 allows an arc discharge between the pair of electrodes 113a and 113b to occur so as to generate a flash discharge in the arc tube 111a. In this way, pulsed light is emitted outside the arc tube 111a.

In this regard, as the VUV-SFL to be used for the experiment for measuring the ozone concentration, the certain VUV-SFL is used in which the inter-electrode distance between the pair of electrodes 113a and 113b, as shown in FIG. 3, is equal to or less than 12.5 mm and a gas containing the xenon gas is enclosed in the arc tube 111a at the enclosing gas pressure of 3 atm. With this configuration, the VUV-SFL is capable of emitting light that has a sufficiently short light emitting length to the extent that the VUV-SFL can be assumed to be a point light source and that contains the VUV light with the sufficiently higher light intensity.

It should be noted that, as the VUV-SFL emitting the VUV light with higher light intensity, applicable one is a VUV-SFL in which the inter-electrode distance between the electrodes is equal to or less than 12.5 mm, the gas containing the xenon gas is enclosed in the arc tube, and the enclosing gas pressure is between 2 atm and 8 atm.

As shown in FIG. 1 and FIG. 2, the excimer lamp and the VUV-SFL have different spectral distribution each other. Since the light that contributes the patterning of the SAM is the VUV light having a wavelength region equal to or less than 200 nm, it is required to confirm the difference in the amount of ozone generation in the experiment for measuring the ozone concentration by equalizing the light irradiation (irradiance) amount in such wavelength region between the excimer lamp and the VUV-SFL.

In this regard, however, the light emitted from the VUV-SFL inevitably contains a wavelength component above and beyond the wavelength of 200 nm, as shown in FIG. 2, while the excimer lamp solely emits the light equal to or less than 200 nm, as shown in FIG. 1. For this reason, when using the VUV-SFL, it is impossible to simply measure the illuminance (irradiance) of the light having the wavelength equal to or less than 200 nm only.

To cope with this circumstance, the inventors of the present invention have focused attention on the fact that an angle of contact (contact angle) of the SAM changes when the SAM is irradiated with the VUV light having the wavelength region equal to or less than 200 nm. Accordingly, the inventors of the present invention have assumed that the percentage of the irradiation amount of the VUV light of the excimer lamp in the light irradiation amount of the whole excimer lamp from when the SAM starts to be irradiated with the light until when the change in the contact angle of the SAM becomes stable is equal to the irradiation amount of the VUV-SFL from when the SAM starts to be irradiated with the light until when the change in the contact angle of the SAM becomes stable. Then, under this assumption, the illuminance of the light having the wavelength equal to or less than 200 nm of the VUV-SFL has been calculated. Hereinafter, the above mentioned procedure will be described in detail.

Figure 4:
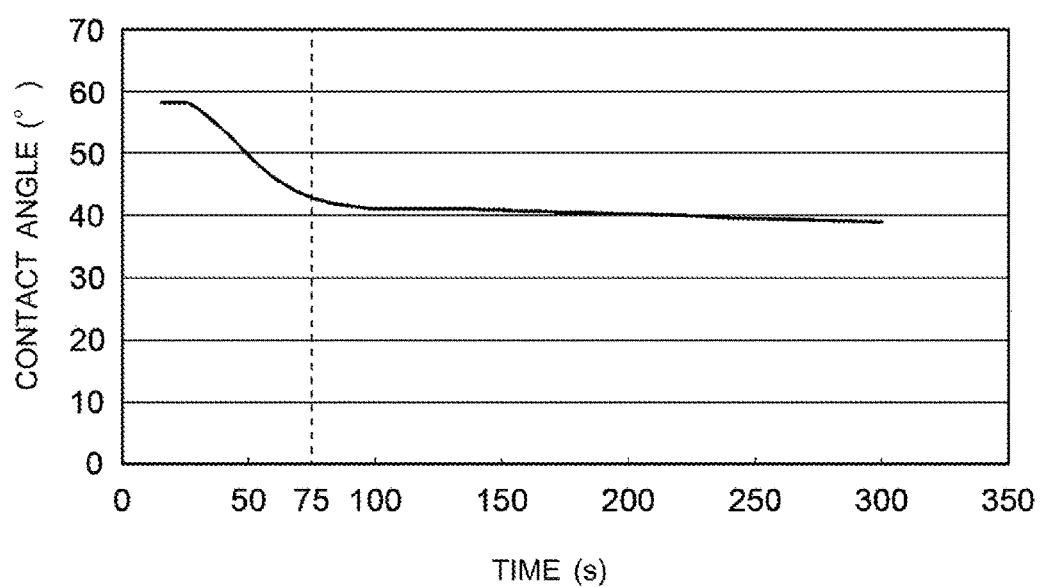
FIG. 4 is a view illustrating a change in an angle of contact of a SAM when the SAM is irradiated with light from the excimer lamp.

FIG. 4 is a view showing the change in the contact angle of the SAM when the SAM is irradiated with the excimer light using the excimer lamp such that the illuminance on the surface of the SAM on the workpiece (substrate) becomes 8.25 mW/cm$^2$ in the atmospheric air. It should be noted that the SAM used here was 1H,1H,2H,2H-perfluoro octyl trimethoxy silane ("FAS13", manufactured by Wako Pure Chemical Industries, Ltd.). As shown in FIG. 4, the change in the contact angle of the SAM became stable by irradiating the SAM with the light for 75 seconds. More particularly, the contact angle of the SAM changed from 58 degrees to 42 degrees and then became substantially stable.

Figure 5:
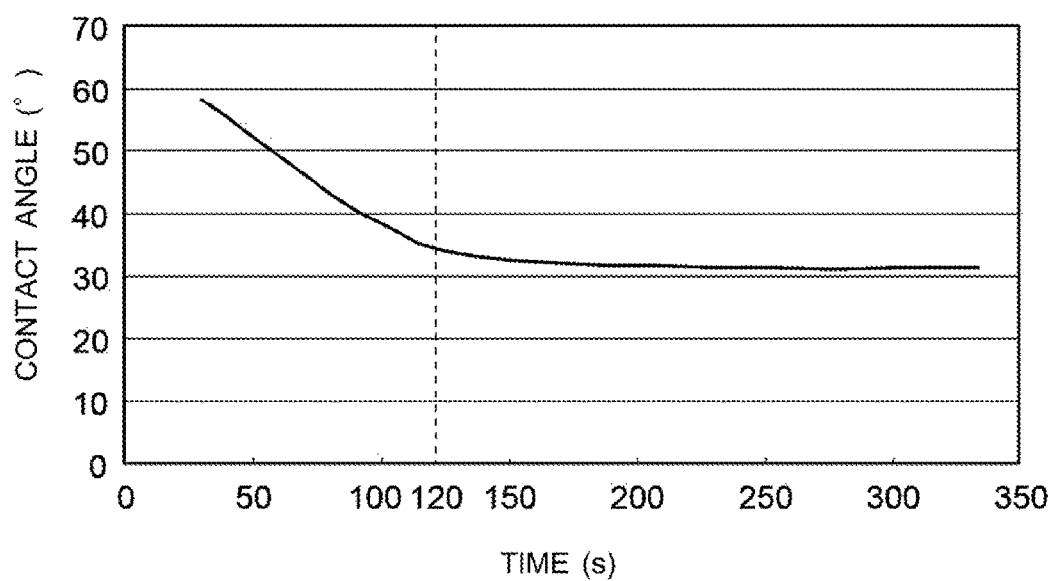
FIG. 5 is a view illustrating a change in an angle of contact of the SAM when the SAM is irradiated with light from the VUV-SFL.

On the other hand, FIG. 5 is a view showing the change in the contact angle of the SAM on the workpiece when the SAM is irradiated with the pulsed light from the VUV-SFL. A charging energy of the capacitor with the capacity of 20 μF, which was charged at 600 V, (that is, ½×20×10$^{-6}$× 600$^2$=3.6 J) was input to the VUV-SFL, and the charged VUV-SFL was lit up at 10 Hz. As shown in FIG. 5, the change in the contact angle of the SAM became stable by irradiating the SAM with the light for 120 seconds. More particularly, the contact angle of the SAM changed from 58 degrees to 33 degrees, and then became substantially stable.

It should be noted that, as shown in FIG. 4 and FIG. 5, even when the contact angles of the SAM when the light irradiation starts are identical to each other between the excimer lamp and the VUV-SFL, the measure of the contact angle when the change in the contact angle becomes stable still differs between the case in which the SAM is irradiated with the VUV-SFL light and the case in which the SAM is irradiated with the excimer lamp light. The reason of such difference is, as apparent from the spectral distributions in FIG. 1 and FIG. 2, the light emitted from the VUV-SFL contains a larger amount of a wavelength component having a wavelength equal to or less than 200 nm (VUV), which has greater energy than the light emitted from the excimer lamp. Thus, it is assumed that the irradiation with the VUV-SFL light onto the SAM has more promoted the decomposition of the SAM with the VUV irradiation.

As described above, the elapsed time until the change in the contact angle of the SAM becomes stable is 120 seconds in the case of the VUV-SFL, and is 75 seconds in the case of the excimer lamp. As a result, it can be assumed that the irradiation amount of the VUV light having the wavelength equal to or less than 200 nm when the SAM is irradiated with the VUV-SFL light for 120 seconds is equal to the irradiation amount of the VUV light when the SAM is irradiated with the excimer lamp light for 75 seconds.

The total irradiation amount of the excimer lamp until the change in the contact angle of the SAM becomes stable is: 75 s×8.25 mW/cm$^2$=618.25 mJ/cm$^2$. That means that the illuminance of the VUV-SFL light having the wavelength equal to or less than 200 nm onto the SAM is, when being converted into the illuminance of the excimer lamp, equivalent to: 75 s/120 s×8.25 mW/cm$^2$=5.16 mW/cm$^2$.

In other words, when the above mentioned VUV-SFL is lit up with the input energy of 3.6 J at 10 Hz, it can be assumed that, with the excimer lamp being lit up at the illuminance of 5.16 mW/cm$^2$, the irradiation amount per unit time of the VUV light having the wavelength equal to or less than 200 nm from both light sources become equal to each other.

Under the above mentioned observation, in the experiment for measuring the ozone concentration, the experiment conducted was to measure the concentration of ozone generated when the VUV-SFL with the 3.6 J input is lit up at 10 Hz and the concentration of ozone generated when the excimer lamp having the center wavelength of 172 nm is lit up at the lighting frequency of 140 kHz, of which illuminance was adjusted to be 5.16 mW/cm$^2$, and to compare both ozone concentrations.

Figure 6:
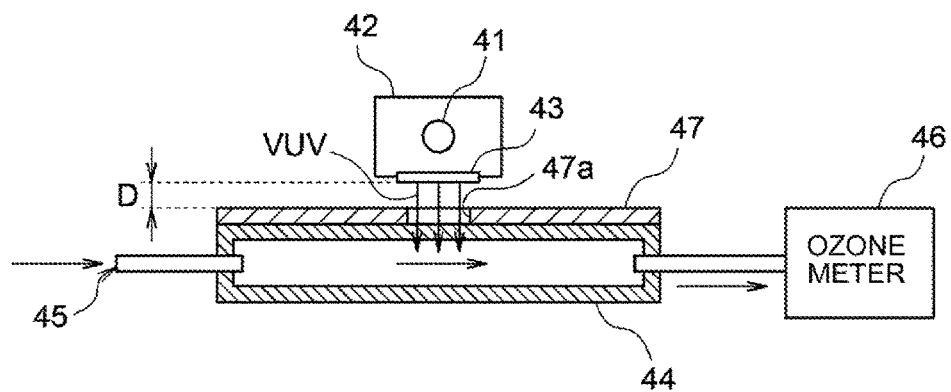
FIG. 6 is a view illustrating an exemplary experimental system for measuring an ozone concentration.

FIG. 6 shows an exemplary configuration of an experimental system used for the experiment for measuring the ozone concentration.

A lamp 41 is the above mentioned excimer lamp, or alternatively, the VUV-SFL. The lamp 41 is accommodated within a lamp housing (or lamp house) 42, and the light emitted from the lamp 41 is radiated to outside from a window 43 having the VUV light permeability, which is provided in the lamp housing 42.

Also, a flow cell 44, which is also made of a VUV light permeable material, is arranged at a light emitting (output) side of the lamp 41. Inside the flow cell 44, an air is introduced from an open end 45 formed at one end of the flow cell 44. The other end of the flow cell 44 is connected to an ozone meter 46. The thickness of the flow cell 44 is, for example, 1 mm, and the cross sectional area thereof is, for example, 3 mm×24 mm, as shown in FIG. 6.

As the ozone meter 46, "EG-2001 RAH035", manufactured by Ebara Jitsugyo Co., Ltd., was used. The gas suction amount of the ozone meter 46 is 1.5 liters/min.

On the light irradiation surface of the flow cell 44, an aluminum foil having an aperture 47a of 1 cm×1 cm square was provided as a mask 47. In other words, the irradiation area of the VUV light onto the air flowing in the flow cell 44 becomes 1 cm$^2$. The gap length D from the window 43 of the lamp housing 42 to a surface of the mask M is, for example, 2.5 mm.

It should be noted that FIG. 6 is depicted in an exaggerated manner simply for making the understanding easier, and the magnitude relationship does not necessarily reflect an actual experimental system.

Figure 7:
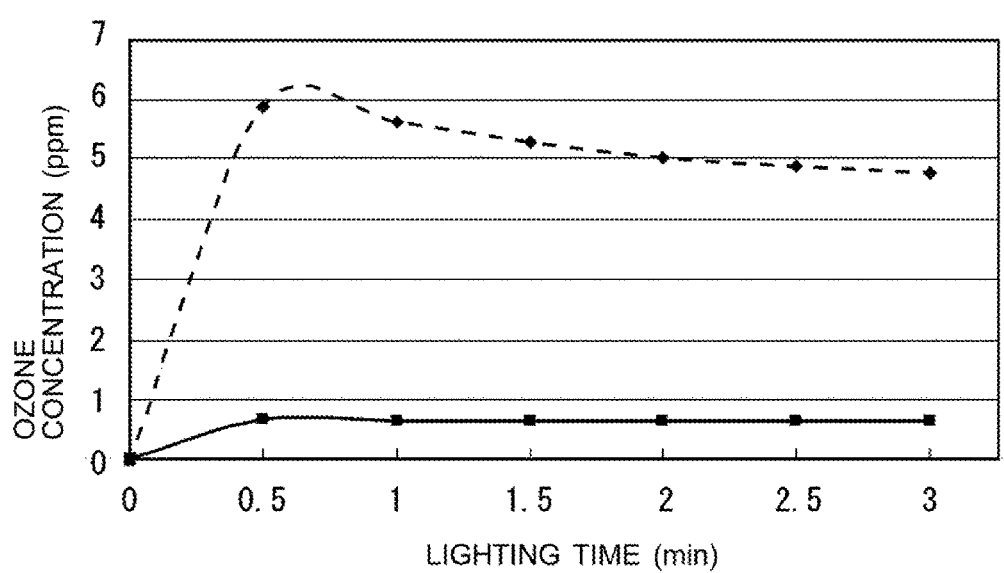
FIG. 7 is a view illustrating a difference in the amount of ozone generation between the excimer lamp and the VUV-SFL.

In the above mentioned experimental system, as mentioned above, the concentration of ozone generated when the VUV-SFL with the input of 3.6 J is lit up at 10 Hz and also the concentration of ozone generated when the excimer lamp having the center wavelength of 172 nm is lit up at the lighting frequency of 140 kHz, of which illuminance on the surface of the flow cell is adjusted to be 5.16 mW/cm$^2$, were measured, respectively. FIG. 7 shows an experimental result thereof.

In FIG. 7, a solid line depicts a measurement result of the ozone concentration of the VUV-SFL, and a dashed line depicts a measurement result of the ozone concentration of the excimer lamp.

As shown in FIG. 7, the ozone concentration when 3 minutes elapsed after the VUV-SFL and the excimer lamp were lit up were 0.64 ppm and 4.78 ppm, respectively. In this way, although the excimer lamp and the VUV-SFL were lit up, respectively, such that the irradiation amount in the VUV regions become identical to each other, still it is observed that the VUV-SFL with the pulsed lighting has a smaller ozone concentration than the excimer lamp. In other words, it is turned out that the VUV-SFL with the pulsed lighting has the smaller amount of ozone generation in the lighting in the atmospheric air.

It should be noted that, in the case in which the excimer lamp is lit up, the reason why the ozone concentration reaches a peak after approximately 30 seconds from the lighting being started, and then gradually decreases is considered as follows. The temperature of the lamp increases after 30 seconds from the lighting being started, the temperature of the enclosed gas in the bulb of the excimer lamp also increases, and the self-absorption of the excimer light by the enclosed gas accordingly increases. As a result, it is considered that the amount of VUV light emission from the excimer lamp gradually decreases.

Figure 8:
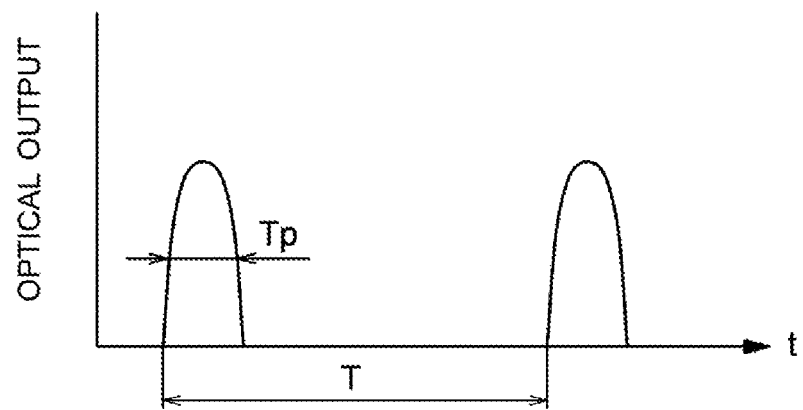
FIG. 8 is a view illustrating a definition of a duty ratio.

As the lighting frequency of the excimer lamp used here is 140 kHz, as shown in FIG. 8, the light emitting interval of the excimer lamp is 7×10$^{-6}$ seconds. It should be noted that, in FIG. 8, the horizontal axis denotes time, and the vertical axis denotes a light output (in arbitrary units). Also, the light emission pulse width tp is approximately 2 μs with FWHM (full width at half maximum).

Accordingly, a duty ratio of the light emission of the excimer lamp (=light emission pulse width tp/light emission interval T) becomes: 2×10$^{-6}$/7×10$^{-6}$=0.29 (29%).

On the other hand, as the lighting frequency of the VUV-SFL is 10 Hz, the light emission interval of the VUV-SFL is 0.1 seconds. Also, the light emission pulse width is approximately 10 μs with FWHM. Accordingly, a duty ratio of the light emission of the VUV-SFL becomes: 1×10$^{-5}$/0.1=1×10$^{-4}$ (0.01%)

As described above, the duty ratio of the light emission significantly differs between the excimer lamp and the VUV-SFL. In light of the above mentioned observation, it can be assumed that such the fact that the duty of the light emission significantly differs between the excimer lamp and the VUV-SFL is contributory to the smaller ozone concentration when the VUV-SFL is lit up compared to the excimer lamp being lit up although the excimer lamp and the VUV-SFL are both lit up such that the light irradiation amount in the VUV regions become identical to each other.

In other words, it is assumed that, when the duty ratio of the light emission is smaller, the ozone generation reaction is less likely to occur by three-body (triple) collision among oxygen atom in the excited state O ($^1$D: excited state), oxygen molecule, and an ambient medium (such as nitrogen molecule or the like).

In order to verify the above mentioned hypothesis, by use of a plurality of lamps that have different duty ratio from the above mentioned lamps (namely, the excimer lamp and the VUV-SFL), the amounts of ozone generation (concentration) were investigated, respectively. it should be noted that the above mentioned excimer lamp is referred to as a lamp A, and the VUV-SFL is referred to as a lamp D.

Other lamps of which ozone generation amount are newly investigated when emitting light are a lamp B and a lamp C, which will be described below.

Namely, the lamp B is an excimer lamp emitting the VUV light having the enter wavelength of 172 nm, and the spectral distribution thereof is identical to the spectral distribution of the lamp A as shown in FIG. 1. The lighting frequency of the lamp B is set to 20 kHz, and the light emission pulse width is set to approximately 2 μs with FWHM.

As the light emission interval of the lamp B is $5\times10^{-5}$ seconds, the duty ratio of the light emission of the lamp B is: $2\times10^{-6}/5\times10^{-5}=0.04$ (4%).

Likewise, the lamp C is a VUV-SFL emitting the VUV light having the wavelength equal to or less than 200 nm, and the spectral distribution thereof is identical to the spectral distribution of the lamp D as shown in FIG. 2. The lighting frequency of the lamp C is set to 100 Hz, and the light emission pulse width is set to approximately 10 μs with FWHM.

As the light emission interval of the lamp C is 0.01 seconds, the duty ratio of the light emission of the lamp C is: $1\times10^{-6}/0.01=0.001$ (0.1%).

It should be noted that, here, an input energy to the lamp B and the lamp C were adjusted, respectively, such that the irradiation amounts of the VUV light of the lamp B and the lamp C become identical to the irradiation amounts of the VUV light of the lamp A and the lamp D, respectively.

By measuring the ozone concentration being generated when 3 minutes elapsed after the lamps A to D were lit up, the following results as shown in Table 1 were obtained.

TABLE 1

| Lamp | Pulse Width [μs] | Oscillating Frequency [Hz] | Light Emission Interval [s] | Duty | Ozone Concentration [ppm] |
| --- | --- | --- | --- | --- | --- |
| A: (Excimer Lamp) | 2 | 140000 | $7\times10^{-6}$ | 0.29 | 4.78 |
| B: (Excimer Lamp) | 2 | 20000 | $5\times10^{-5}$ | 0.04 | 4.43 |
| C: (VUV-SFL) | 10 | 100 | 0.01 | 0.001 | 2.43 |
| D: (VUV-SFL) | 10 | 10 | 0.1 | 0.0001 | 0.64 |

It should be noted that the measurement point of the ozone concentration was set to be after 3 minutes elapsed because the lighting operation of the lamps A to D become substantially stable when 3 minutes elapses after the lamps are lit up, respectively.

Figure 9:
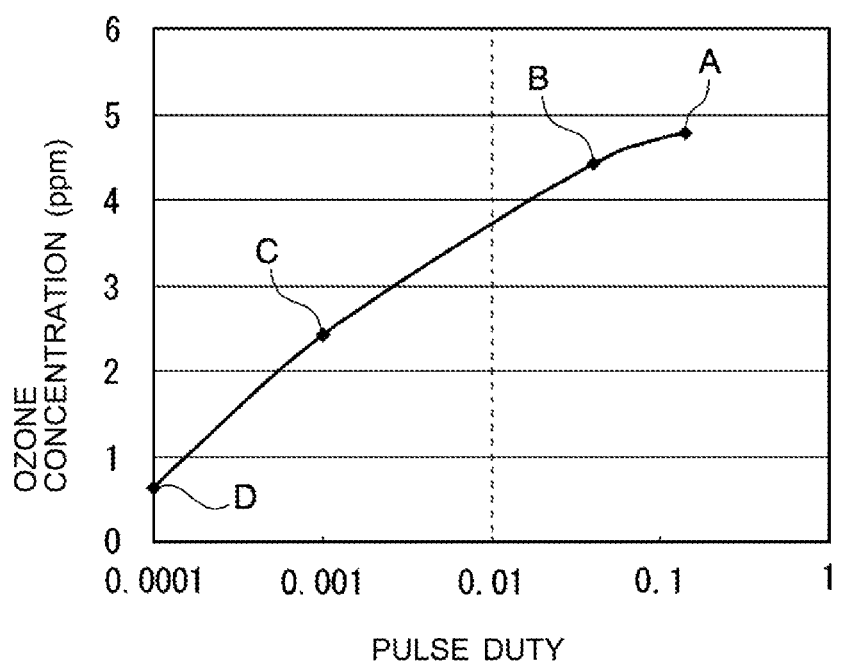
FIG. 9 is a view illustrating a relationship between the duty ratio and the ozone concentration.

FIG. 9 is a view showing the relationship between the light emission duty ratio and the ozone concentration based on the results shown in the above Table 1.

As apparent from FIG. 9, in the case in which the pulsed light containing the light in the VUV region is radiated in the atmospheric air, assuming the irradiation amount in the VUV region into the air is identical to one another, it is turned out that the amount of ozone generation becomes smaller as the duty ratio of the light emission becomes smaller.

Figure 12:
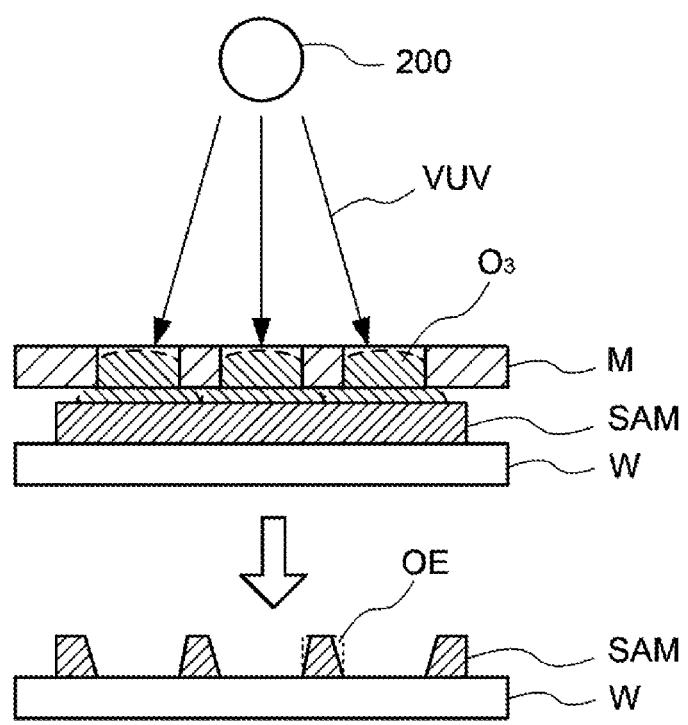
FIG. 12 is a view illustrating an example of the ozone etching.

In addition, by use of the lamps A to D, respectively, the patterning of the SAM (namely, "FAS13" manufactured by Wako Pure Chemical Industries, Ltd.) was performed in the atmospheric air, respectively. As a result, in the case in which the lamp A and the lamp B are used, respectively, it was observed that the so-called ozone etching OE, such as an enlarged etching width or a partial defect of the SAM or the like, has been generated to the extent being not negligible, as shown in, for example, FIG. 12, due to the oxidative decomposition reaction between the ozone generated and the SAM. Accordingly, a satisfactory patterning failed to be attained.

Figure 11:
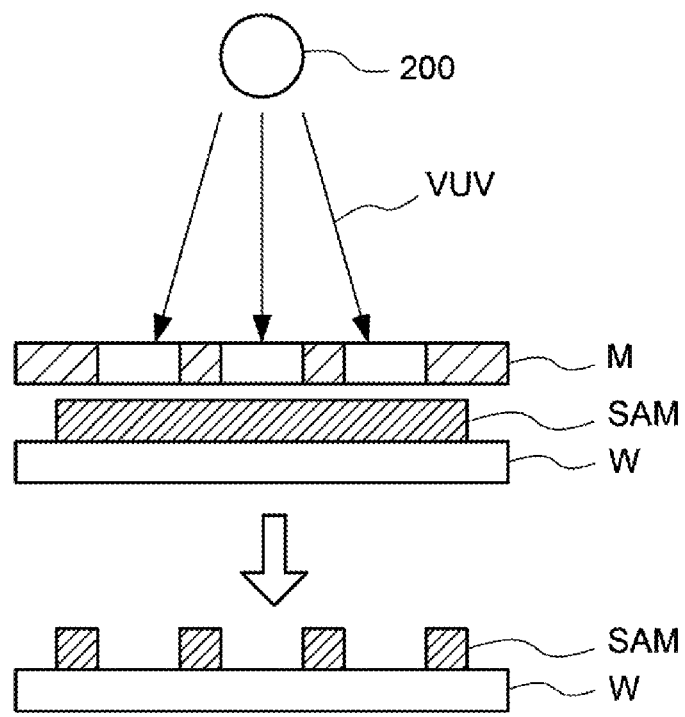
FIG. 11 is a view illustrating a method for patterning the SAM.

On the other hand, in the case in which the lamp C and the lamp D are used, respectively, it was observed that a satisfactory patterning was successfully attained, as shown in, for example, FIG. 11, due to the smaller oxidative decomposition reaction between the ozone generated and the SAM, as the concentration of ozone generated is relatively smaller.

Yet furthermore, in investigating the relationship between the ozone concentration generated and the patterning accuracy, it was confirmed that the deformation of the patterning due to the ozone etching becomes considerable if the ozone concentration generated is equal to or greater than 4 ppm.

As shown in FIG. 9, when the duty ratio of the light emission is equal to or less than 0.01, then it is possible to reduce the ozone concentration generated to be less than 4 ppm with an absolute accuracy. In other words, when the SAM undergoes the patterning by use of the VUV light, it is possible to attain the patterning with the higher accuracy by using a light source that emits the pulsed light and has the duty ratio of the light emission equal to or less than 0.01, as the lamp C and the lamp D (namely, the VUV-SFL).

As a result, when the SAM film undergoes the patterning by use of the VUV light, the present embodiment employs a flash lamp that emits the pulsed light and has the duty ratio of the light emission equal to or less than 0.01 and greater than 0. More particularly, the above mentioned duty ratio of the light emission is to be set to equal to or greater than 0.00001 and equal to or less than 0.01. When the duty ratio becomes smaller, then it is required to increase an output per one light emission, because the number of light emission per unit time decreases. In other words, the input power to the lamp is required to be larger so that the power feeder unit, which includes a capacitor (now shown) storing the prescribed energy, is required to increase in size. In this regard, the reason why the lower limit of the duty ratio is set to 0.00001 is because, when the duty ratio becomes below 0.00001, the above mentioned power feeder unit 15 becomes too large to be practically used in order to increase the light output per one light emission.

More preferably, the duty ratio of the light emission is set to equal to or greater than 0.0001 and equal to or less than 0.001. With the duty ratio being set so, it is possible to sufficiently reduce the ozone concentration generated to the extent being practically no problem under the lighting condition that is relatively easily feasible, such as the above mentioned lamp C and the lamp D.

Figure 10:
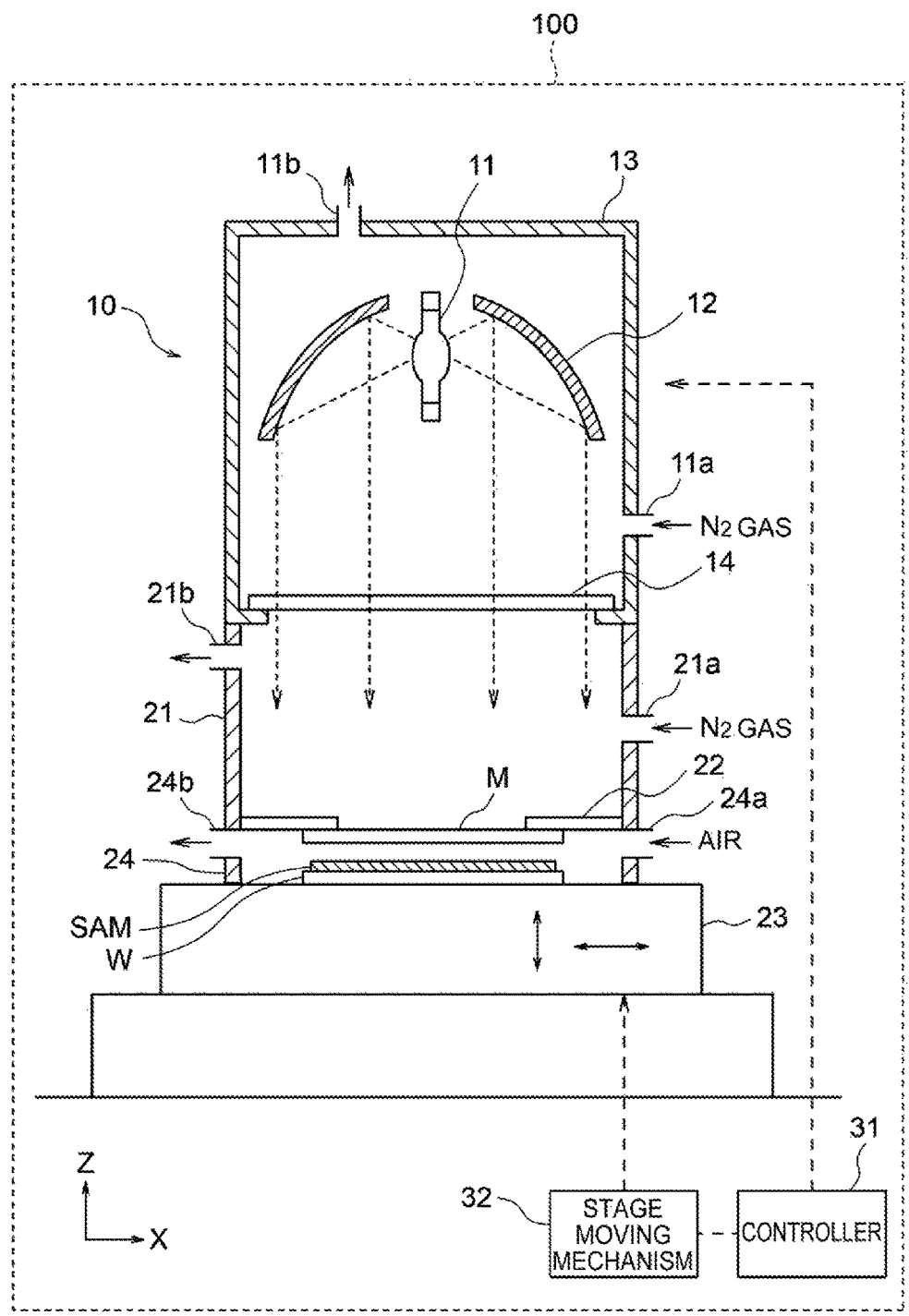
FIG. 10 is a view illustrating an exemplary configuration of a light irradiation device.

FIG. 10 is a view showing an exemplary configuration of a light irradiation device configured to pattern the SAM by use of the VUV light.

The light irradiation device 100 includes a vacuum ultra violet light source device 10 which radiates the VUV light. The vacuum ultra violet light source device 10 includes a flash lamp 11, a paraboloid mirror 12, a lamp housing 13, and a window 14 provided in the lamp housing 13.

The flash lamp 11 is a VUV-SFL which has, for example, a configuration shown in FIG. 3. More particularly, the flash lamp 11 includes an arc tube 111a which is made of the vacuum ultra violet light permeable material, and a pair of electrodes 113a and 113b arranged in the arc tube 111a and facing (opposing) each other. The inter-electrode distance between the electrodes of the pair of electrodes 113a and 113b is equal to or less than 12.5 mm, and a gas containing a xenon gas is enclosed in the arc tube 111a at the enclosing gas pressure of 3 atm.

It should be noted that, although not in particular illustrated in the drawings, the vacuum ultra violet light source device 10 includes a power feeder unit that has the similar configuration to the power feeder unit 15 as shown in FIG. 3.

The flash lamp 11 is drive controlled by a controller 31 such that the flash lamp 11 emits pulsed light having the duty ratio equal to or greater than 0.00001 and equal to or less than 0.01 (for example, 0.001 here). In other words, the controller 31 drive controls the power feeder unit of the vacuum ultra violet light source device 10, inputs to the flash lamp 11 the charging energy of the capacitor with the capacity of 20 μF (3.6 J), which is charged at 600 V so as to light up the flash lamp 11 at 10 Htz.

The VUV light emitted from the flash lamp 11 is reflected by the paraboloid mirror 12 to become parallel light, and emits (outputs) from the window 14 provided in the lamp housing 13. The window 14 is formed with, for example, a synthetic quartz (synthetic silica) having a higher light permeability with respect to the VUV light. Alternatively, the window 14 may be formed with, for example, a sapphire glass, calcium fluoride, or magnesium fluoride or the like that has a higher light permeability with shorter wavelength than the quartz.

The window 14 is assembled with the lamp housing 13 in an air tight manner. Inside the lamp housing 13, an inert gas such as a nitrogen ($N_2$) gas or the like is introduced from a gas inlet (installation) port 13a provided in the lamp housing 13, and oxygen is purged by the inert gas. This is because otherwise the VUV light considerably undergoes the absorption and attenuation by oxygen. By purging inside the lamp housing 13 by the inert gas such as $N_2$ gas or the like, it is possible to prevent the absorption and attenuation of the VUV light by oxygen from occurring. Furthermore, the inert gas introduced inside the lamp housing 13 cools the flash lamp 11 or the paraboloid mirror 12, and then is exhausted from an exhaust outlet port 13b provided in the lamp housing 13.

It should be noted that inside the lamp housing 13 may be alternatively, for example, vacuum.

The VUV light emitted from the vacuum ultra violet light source device 10 is incident to the mask M. The mask M is configured by, for example, vapor depositing (evaporating) metal such as chrome or the like on a transparent substrate such as glass or the like, and etching the vapor deposited metal to form a pattern (irradiation pattern). A workpiece W is irradiated with the VUV light through the mask M.

At the light emitting side of the vacuum ultra violet light source device 10, an enclosure (enclosing) member 21 is provided that encloses a light path through which the light emitted from the vacuum ultra violet light source device 10 and incident to the mask M advances. The mask M is being suction held by a mask stage 22 fixed to the enclosure member 21 while the mask M is kept horizontal.

Inside the window 14, the enclosure member 21, the mask stage 22 of the vacuum ultra violet light source device 10, and the mask M is a closed (enclosed) space. The enclosure member 21 is provided with a gas inlet port 21a. Inside the enclosure member 21, which becomes the closed space, the inert gas such as $N_2$ gas is introduced from the gas inlet port 21a, and oxygen is pursed by the inert gas inside the enclosure member 21. This is due to the same reason as the reason why oxygen is purged by the inert gas inside the lamp housing 13. Furthermore, the inert gas introduced inside the enclosure member 21 is then exhausted from an exhaust port 21b provided in the enclosure member 21.

It should be noted that inside the enclosure member 21 may be alternatively, for example, vacuum.

The workpiece W is mounted on the work stage 23, and being suction held (chucked) by, for example, a vacuum chuck mechanism. On the workpiece W, the SAM film (SAM) is formed, and arranged to be distant from the mask M by approximately 100 μm. Yet furthermore, between the work W and the mask M, an air layer is formed.

More particularly, at the light emitting (output) side of the mask M, the enclosure member 24 is provided that encloses a light path through which the light that transmits the mask M and is irradiated onto the workpiece W. Between the workpiece W and the mask M, an air is introduced from the air inlet port 24a which is formed in the enclosure member 24. The air introduced from the air inlet port 24a is then exhausted from an exhaust port 24b. It should be noted that between the mask M and the workpiece W is not limited to be the air layer but may be sufficient as long as a gas layer containing oxygen is formed.

It should be also noted that the work stage 23 is configured to be movable in the X, Y, Z and θ directions (that is, the horizontal direction, the anteroposterior direction, the vertical direction, and the rotational direction about the Z axis in FIG. 10) by a stage moving mechanism 32. The stage moving mechanism 32 is drive controlled by the controller 31.

More particularly, the VUV light irradiation process onto the workpiece W is performed as the followings.

First, the controller 31 drive controls the vacuum chuck mechanism or the like to hold the mask M, which is set to the prescribed position on the mask stage 22 by the vacuum suction. Next, the controller 31 lowers the work stage 23 by the stage moving mechanism 32 to cause the workpiece W to be mounted on the work stage 23. Subsequently, the controller 31 uplifts the work stage 23 by the stage moving mechanism 32 to be cause the workpiece W to be set (positioned) at the prescribed irradiation position of the VUV light. Next, the controller 31 moves the work stage 23 by the stage moving mechanism 32 in the X, Y, and θ directions to perform the position adjustment (that is, alignment) between the mask M and the workpiece W. In other words, the controller 31 causes an alignment mark marked on the mask M and an alignment mark marked on the workpiece W to coincide with each other.

After the alignment between the mask M and the workpiece W is finished, the vacuum ultra violet light source device 10 irradiates the mask M with the VUV light, which is parallel light, to perform the light patterning process of the SAM onto the workpiece W. Subsequently, after the light patterning process is finished, the controller 31 lowers the work stage 23 by the stage moving mechanism 32, stops supplying the vacuum to the work stage 23 to cause the workpiece W, which is already irradiated, to be removable from the work stage 23.

As described above, the light irradiation device 100 according to the present embodiment prepares the mask M on which the pattern is formed, arranges the mask M and the workpiece W to be proximate to each other in parallel, and radiate the VUV light, which is the parallel light, only onto a portion on the workpiece W of which characteristic is desired to be changed. In this way, the light patterning process is performed with respect to the workpiece W.

At this moment, the light irradiation device 100 irradiates the workpiece W with the VUV light in the atmosphere containing oxygen such as an atmospheric air. For this reason, when the SAM is irradiated with the VUV light, oxygen in the vicinity of the surface of the SAM becomes active (radical) oxygen due to the VUV irradiation. Thus, it is possible to perform the oxidative decomposition reaction of the SAM film with the active oxygen as well as the direct decomposition of the SAM film by the VUV light. As a result, it makes it possible to improve the patterning rate as compared to the case in which the oxidative decomposition reaction due to the active oxygen is not performed, such as the VUV irradiation onto the SAM film in the inert gas atmosphere that does not contain oxygen.

Yet furthermore, the vacuum ultra violet light source device 10 emits, as the VUV light to be radiated onto the workpiece W, light that is the pulsed light and having the duty ratio of the light emission equal to or less than 0.01. With the light source device 10 being so configured, it makes it possible to suppress the generation amount of ozone generated by absorbing the VUV light with the oxygen molecule in the atmospheric air. In particular, by setting the duty ratio of the light emission to be equal to or greater than 0.0001 and equal to or less than 0.001, it makes it possible to sufficiently reduce the ozone concentration generated to the extent being practically no problem. As a result, it makes it possible to suppress the deformation of the patterning due to the ozone etching so as to attain the satisfactory patterning.

Yet furthermore, the flash lamp 11 is applied (employed) as the light source that emits light that is the pulsed light and has the duty ratio of the light emission equal to or less than 0.01, it makes it possible to appropriately emit the VUV light that satisfies the above mentioned condition.

Yet furthermore, as the flash lamp 11, a certain flash lamp is applied that has the light emission length (that is, inter-electrode distance) equal to or less than 12.5 mm and encloses a gas containing xenon gas in the arc tube. In this way, by using the light source that can be assumed as the substantially point light source, it makes it possible to perform the lithographic exposure that has less sneaking of the light. As a result, it makes it possible to attain the finer patterning in the pattern line width.

Modification to Embodiments

In the above mentioned embodiments, when the illuminance distribution of the VUV light irradiated onto the workpiece W is required to be uniformed, the light irradiation device 100 may be configured as the followings.

In the vacuum ultra violet light source device 10, the paraboloid mirror 12 is configured to be an elliptical light condenser mirror, and the light emitting part of the flash lamp 11 is arranged at a first focal point of the elliptical light condenser mirror. In addition, an integrator is arranged at a second focal point at which the light emitted from the window 14 is condensed, and the light from the integrator is converted into the parallel light by a collimator lens or a collimator mirror to be radiated onto the mask M.

It should be noted that the integrator and the collimator lens or the collimator mirror are on the light path on which the light that is emitted from the vacuum ultra violet light source device 10 and radiated onto the workpiece W advances. For this reason, those components are required to be made of a material that has a sufficiently high light permeability in the VUV region, and are accommodated inside the enclosure member 21.

While certain embodiments have been described above, these embodiments have been presented by way of example only, and are not intended to limit the scope of the present invention. The novel apparatuses and methods thereof described herein may be embodied in a variety of other forms. Furthermore, various omissions, substitutions and modifications in the form of the apparatuses and methods thereof described herein may be made without departing from the gist of the present invention. The accompanying claims and their equivalents are intended to cover such forms or modifications as would fall within the scope and gist of the present invention.

INDUSTRIAL APPLICABILITY

According to a vacuum ultra violet light source device of the present invention, it makes it possible suppress the amount of ozone generated when the vacuum ultra violet light is emitted in an atmosphere containing oxygen such as an atmospheric air. Thus, the vacuum ultra violet light source device of the present invention is useful. In addition, according to a light irradiation device incorporating the vacuum ultra violet light source device, in the patterning process of the SAM in the atmosphere containing oxygen, it makes it possible to suppress the undesired ozone etching due to the oxidative decomposition reaction of the SAM with the ozone generated so as to attain the satisfactory and desirable patterning. Thus, the light irradiation device of the present invention is also useful.

REFERENCE SIGNS LIST

10 Vacuum Ultra Violet Light Source Device
11 Flash Lamp (VUV-SFL)
12 Paraboloid Mirror
13 Lamp Housing
14 Window
15 Power Feeder Unit
21 Enclosure Member
21a Gas Inlet Port
21b Exhaust Port
22 Mask Stage
23 Work Stage
24 Enclosure Member
24a Air Inlet Port
24b Exhaust Port
31 Controller
32 Stage Moving Mechanism
41 Lamp
42 Lamp Housing
43 Window
44 Flow Cell
45 Open End 46 Ozone Meter
47 Mask
47a Aperture
111a Arc Tube
111b First Sealing Tube
111c Second Sealing Tube
112 Glass Tube for Sealing
113a First Main Electrode
113b Second Main Electrode
114a Lead
114b Lead
115a and 115b Starting Auxiliary Electrodes
116a and 116b Internal Leads
117a and 117b External Leads
118a and 118b Metal Foils
119 Supporter
M Mask
SAM Self-assembled Monolayer (SAM film)
W Workpiece

What is claimed is:

1. A light irradiation device comprising:
a mask arranged to be apart from a workpiece on which a self-assembled monolayer is formed, the mask having a prescribed pattern being formed on the mask;
a light source for irradiating the workpiece with light containing vacuum ultra violet light through the mask; and
a gas introduction unit having an inlet port and an outlet port for introducing gas containing oxygen between the mask and the workpiece so as to form a gas layer containing oxygen between the mask and the workpiece,
the light containing the vacuum ultra violet light being pulsed light and having a duty ratio of light emission equal to or greater than 0.00001 and equal to or less than 0.01.

2. The light irradiation device according to claim 1, wherein the duty ratio of the light emission is equal to or greater than 0.0001 and equal to or less than 0.001.

3. The light irradiation device according to claim 2, further comprising:
a flash lamp including an arc tube made of a vacuum ultra violet light permeable material; and a pair of electrodes arranged in the arc tube and configured to face each other; and
a power feeder unit configured to feed power to the flash lamp.

4. The light irradiation device according to claim 3, wherein the flash lamp has an inter-electrode distance between the pair of electrodes equal to or less than 12.5 mm, and encloses gas containing xenon gas in the arc tube.

5. The light irradiation device according to claim 2, further comprising:
an enclosure member configured to enclose a light path of the light from the vacuum ultra violet light source device to the mask; and
a second inlet port for introducing inert gas into the enclosure member and a second outlet port for exhausting the inert gas from the enclosure member so as to purge inside the enclosure member.

6. The light irradiation device according to claim 1, further comprising:
a flash lamp including an arc tube made of a vacuum ultra violet light permeable material; and a pair of electrodes arranged in the arc tube and configured to face each other; and
a power feeder unit configured to feed power to the flash lamp.

7. The light irradiation device according to claim 6, wherein the flash lamp has an inter-electrode distance between the pair of electrodes equal to or less than 12.5 mm, and encloses gas containing xenon gas in the arc tube.

8. The light irradiation device according to claim 7, further comprising:
an enclosure member configured to enclose a light path of the light from the vacuum ultra violet light source device to the mask; and
a second inlet port for introducing inert gas into the enclosure member and a second outlet port for exhausting the inert gas from the enclosure member so as to purge inside the enclosure member.

9. The light irradiation device according to claim 6, further comprising:
an enclosure member configured to enclose a light path of the light from the vacuum ultra violet light source device to the mask; and
a second inlet port for introducing inert gas into the enclosure member and a second outlet port for exhausting the inert gas from the enclosure member so as to purge inside the enclosure member.

10. The light irradiation device according to claim 1, further comprising:
an enclosure member configured to enclose a light path of the light from the vacuum ultra violet light source device to the mask; and
a second inlet port for introducing inert gas into the enclosure member and a second outlet port for exhausting the inert gas from the enclosure member so as to purge inside the enclosure member.

11. A method of patterning a self-assembled monolayer, comprising:
irradiating a self-assembled monolayer formed on a workpiece with light containing vacuum ultra violet light through a mask on which a prescribed pattern is formed,
the light containing the ultra violet light being pulsed light and having a duty ratio of light emission equal to or greater than 0.00001 and equal to or less than 0.01;
generating active oxygen from the oxygen contained in gas between the mask and the workpiece by irradiating the self-assembled monolayer with the light containing vacuum ultra violet light; and
using the active oxygen, oxidizing and decomposing a region of the self-assembled monolayer irradiated by the light containing the vacuum ultra violet light so as to remove the region of the self-assembled monolayer from the workpiece.

12. The method of patterning the self-assembled monolayer according to claim 11, wherein
the method irradiates the self-assembled monolayer with light that has the duty ratio of the light emission equal to or greater than 0.001 and equal to or less than 0.001 as the light containing the vacuum ultra violet light.

* * * * *